United States Patent
Hirose et al.

(10) Patent No.: US 9,508,880 B2
(45) Date of Patent: Nov. 29, 2016

(54) METHOD FOR PROCESSING A MINUTE STRUCTURE ON A SURFACE OF THE SILICON SUBSTRATE

(71) Applicant: SEMICONDUCTOR ENERGY LABORATORY CO., LTD., Atsugi-shi, Kanagawa-ken (JP)

(72) Inventors: Takashi Hirose, Kanagawa (JP); Ryosuke Motoyoshi, Kanagawa (JP)

(73) Assignee: SEMICONDUCTOR ENERGY LABORATORY CO., LTD., Kanagawa-ken (JP)

(*) Notice: Subject to any disclaimer, the term of this patent is extended or adjusted under 35 U.S.C. 154(b) by 160 days.

(21) Appl. No.: 13/649,398

(22) Filed: Oct. 11, 2012

(65) Prior Publication Data

US 2013/0102107 A1   Apr. 25, 2013

(30) Foreign Application Priority Data

Oct. 20, 2011   (JP) .................... 2011-230434

(51) Int. Cl.

| H01L 29/12 | (2006.01) |
|---|---|
| H01L 29/06 | (2006.01) |
| H01L 29/04 | (2006.01) |
| H01L 33/00 | (2010.01) |
| H01L 31/0236 | (2006.01) |

(52) U.S. Cl.
CPC .......... *H01L 31/02363* (2013.01); *Y02E 10/50* (2013.01)

(58) Field of Classification Search
CPC ................... H01L 31/02363; Y02E 10/50
USPC ........ 438/71, 57, 97, 29; 257/458, E31.032, 257/431, 59, E31.13, 43, 53; 136/255, 25, 136/256, 258
See application file for complete search history.

(56) References Cited

U.S. PATENT DOCUMENTS

| 5,213,628 A | 5/1993 | Noguchi et al. |
| 5,891,264 A * | 4/1999 | Shinohara et al. ........... 136/261 |

(Continued)

FOREIGN PATENT DOCUMENTS

| EP | 2533296 A | 12/2012 |
| JP | 10-112458 A | 4/1998 |

(Continued)

OTHER PUBLICATIONS

Morinaga.H et al., "Behavior of Ultrafine Metallic Particles on Silicon Wafer Surface,", J. Electrochem. Soc. (Journal of the Electrochemical Society), Mar. 1, 1995, vol. 142, No. 3, pp. 966-970.

*Primary Examiner* — Dzung Tran

(74) *Attorney, Agent, or Firm* — Nixon Peabody LLP; Jeffrey L. Costellia

(57) ABSTRACT

It is an object to provide a method for processing a silicon substrate that can reduce surface reflectance as much as possible. The method includes a first step of forming a thin film including a metal having higher electronegativity than silicon and having a plurality of openings on a silicon substrate, a second step of soaking the silicon substrate subjected to the first step in a hydrofluoric acid solution containing oxidizer, and a third step of soaking the silicon substrate subjected to the second step in an ammonia aqueous solution containing oxidizer. By performing the steps in the above order, a minute uneven structure is formed on a surface of the silicon substrate to reduce the reflectance.

20 Claims, 13 Drawing Sheets

(56) References Cited

U.S. PATENT DOCUMENTS

| | | | |
|---|---|---|---|
| 5,972,236 A | 10/1999 | Tanaka et al. | |
| 6,534,336 B1* | 3/2003 | Iwane et al. | 438/71 |
| 6,613,603 B1* | 9/2003 | Sano | 438/72 |
| 6,951,989 B2* | 10/2005 | Nufer et al. | 177/180 |
| 2001/0029978 A1* | 10/2001 | Nakai et al. | 136/258 |
| 2004/0112426 A1* | 6/2004 | Hagino | 136/261 |
| 2008/0271783 A1* | 11/2008 | Murakami et al. | 136/258 |
| 2010/0015756 A1* | 1/2010 | Weidman | H01L 21/67155 438/96 |
| 2010/0051099 A1* | 3/2010 | Cheong et al. | 136/256 |
| 2011/0041910 A1 | 2/2011 | Shimomura et al. | |
| 2011/0294255 A1* | 12/2011 | Lin et al. | 438/98 |
| 2012/0298191 A1 | 11/2012 | Yamazaki | |
| 2012/0325291 A1 | 12/2012 | Yokosawa et al. | |
| 2013/0020568 A1 | 1/2013 | Yamazaki | |
| 2013/0087789 A1 | 4/2013 | Hirose et al. | |

FOREIGN PATENT DOCUMENTS

| | | |
|---|---|---|
| JP | 2002-289889 A | 10/2002 |
| JP | 2005-183505 | 7/2005 |
| JP | 2005-277295 A | 10/2005 |
| JP | 2007-194485 | 8/2007 |
| JP | 2008-124413 A | 5/2008 |
| JP | 2010-245568 | 10/2010 |
| JP | 2011-159783 A | 8/2011 |

* cited by examiner

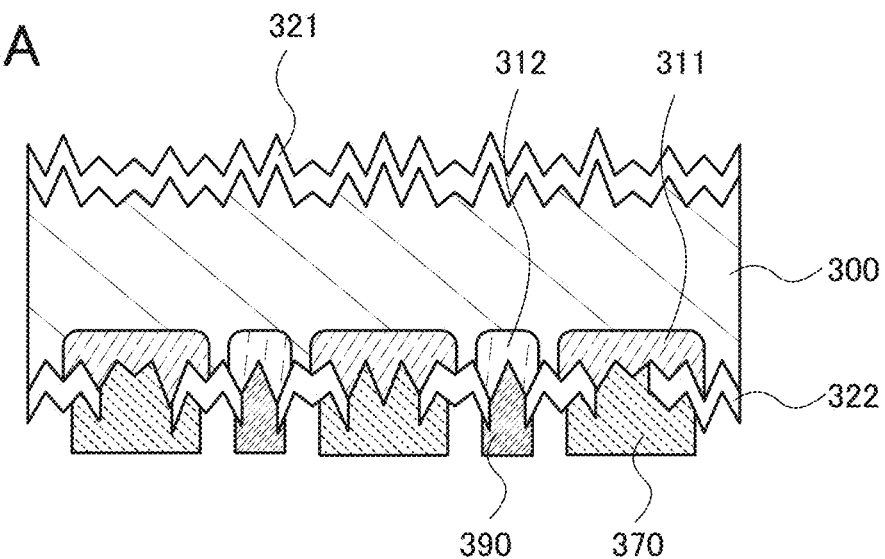
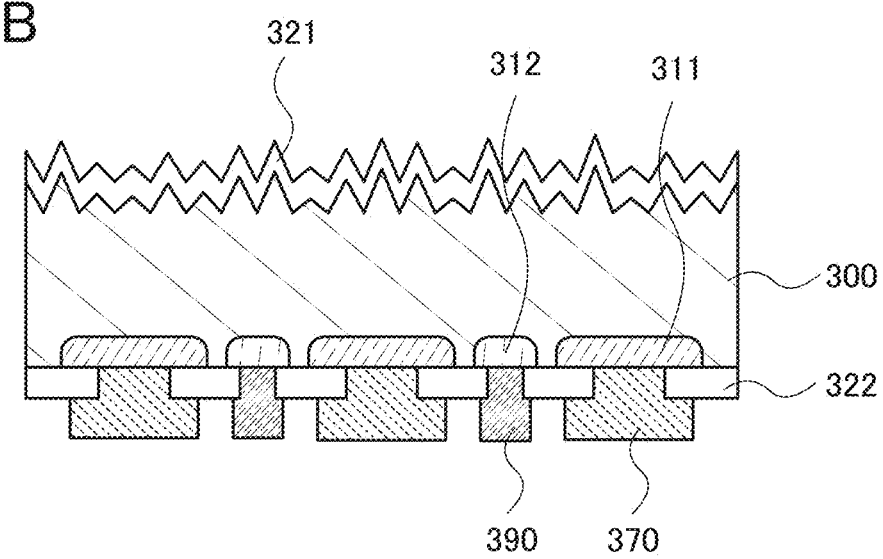

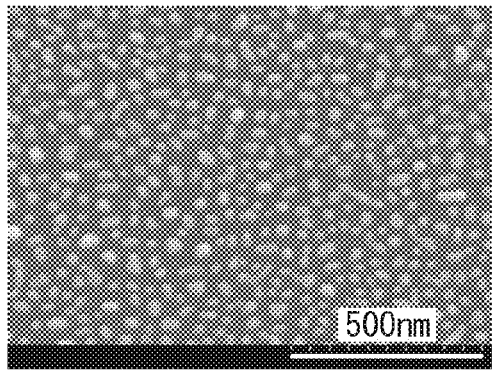
FIG. 11A Ag – 4nm
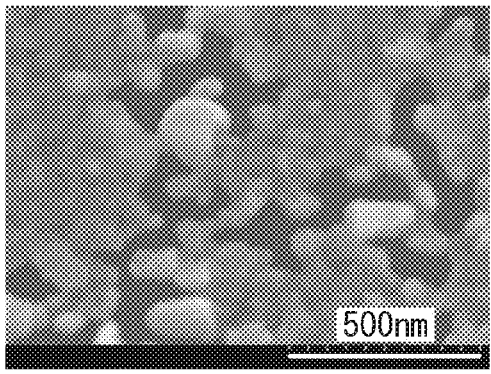
FIG. 11D Ag – 15nm
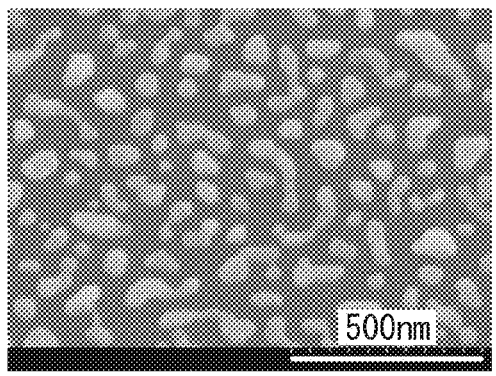
FIG. 11B Ag – 8nm
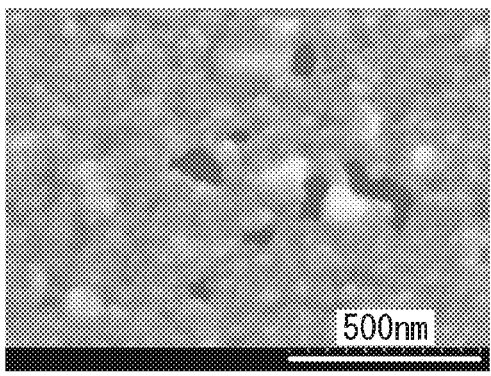
FIG. 11E Ag – 20nm
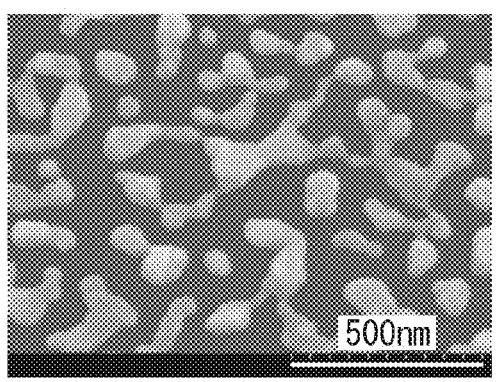
FIG. 11C Ag – 11nm
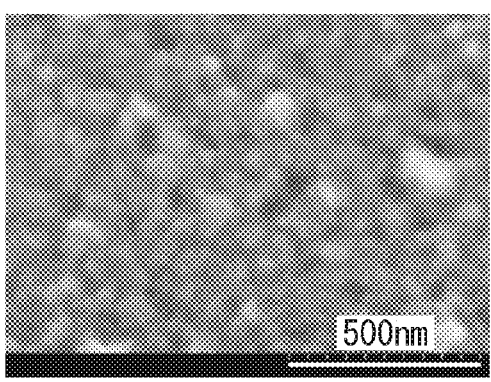
FIG. 11F Ag – 30nm FORMING THIN FILM    ETCHING SURFACE
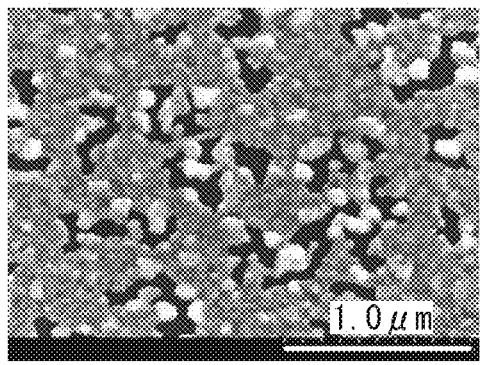 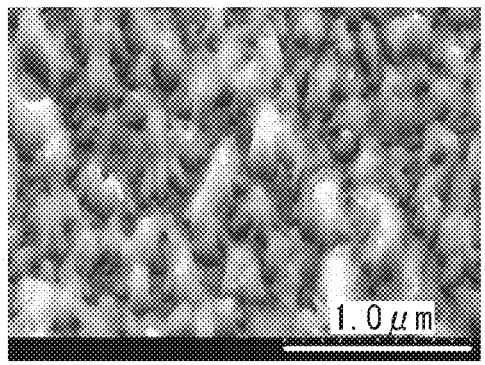
FIG. 12A1 Ag – 17nm    FIG. 12A2  Ag – 17nm
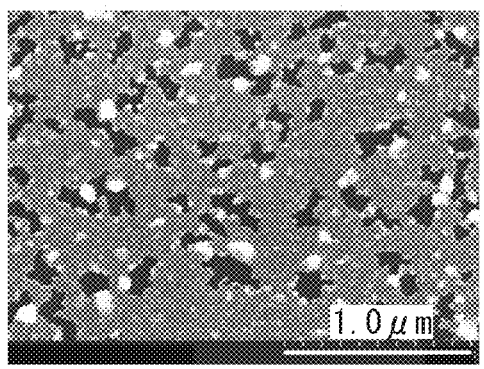 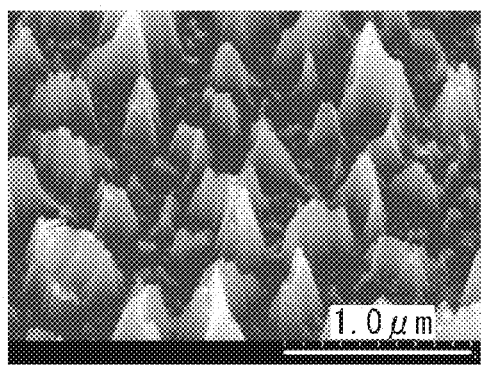
FIG. 12B1 Ag-Pd – 8nm    FIG. 12B2  Ag-Pd – 8nm
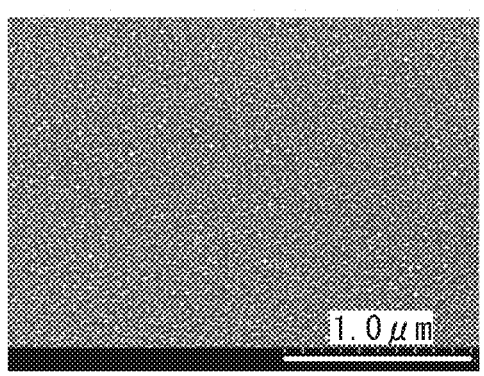 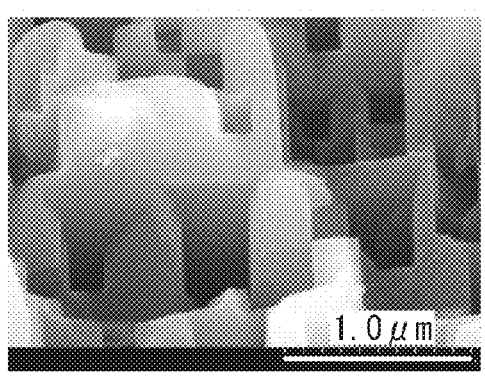
FIG. 12C1 Ag-Pd – 2nm    FIG. 12C2 Ag-Pd – 2nm

METHOD FOR PROCESSING A MINUTE STRUCTURE ON A SURFACE OF THE SILICON SUBSTRATE

BACKGROUND OF THE INVENTION

1. Field of the Invention

The present invention relates to a method for processing a silicon substrate in which a minute structure is formed on a surface of the silicon substrate.

2. Description of the Related Art

In a photoelectric conversion device such as a solar cell formed using a silicon substrate, a structure in which minute unevenness is formed on a light-receiving surface, which is also referred to as a texture structure, is often used. On the surface processed to have unevenness, multiply-reflected light is incident, and the light obliquely propagates into a photoelectric conversion region; thus, the light pass length is increased. Further, a light trapping effect in which reflected light by a back electrode or the like of light propagated into the photoelectric conversion region is totally reflected at the surface can occur, and thus the electric characteristics of the photoelectric conversion device can be greatly improved.

As a method for forming such unevenness on a surface of a silicon substrate, a method in which a single crystal silicon substrate is anisotropically etched using an alkaline solution to form pyramid-shaped unevenness is known. Note that the method utilizes a difference in etching rates among plane orientations and is not suitable for a polycrystalline silicon substrate whose plane orientation is random on a surface of the substrate.

Further, a method in which a metal is deposited on a surface of a silicon substrate in a mixture solution containing a metal ion, oxidizer, and hydrofluoric acid to make the surface of the silicon substrate porous by utilizing the catalytic action of the metal and to form unevenness is disclosed in Patent Document 1.

Further, as a similar method, a method in which metal particles are deposited on a surface of a silicon substrate having unevenness in a plating solution to make the surface of the silicon substrate porous in a mixture solution containing oxidizer and hydrofluoric acid and to form unevenness is disclosed in Patent Document 2.

REFERENCE

[Patent Document 1] Japanese Published Patent Application No. 2005-183505
[Patent Document 2] Japanese Published Patent Application No. 2007-194485

SUMMARY OF THE INVENTION

However, it can hardly be said that reflectance of a surface of silicon formed by the methods disclosed in Patent Documents 1 and 2 is sufficiently reduced; a further reduction in reflectance is needed to improve electric characteristics of a photoelectric conversion device, for example.

Therefore, an object of one embodiment of the present invention is to provide a method for processing a silicon substrate that can reduce reflectance of a surface of the silicon substrate as much as possible.

One embodiment of the present invention disclosed in this specification relates to a method for processing a silicon substrate in which a metal layer is formed on a surface of the silicon substrate and the silicon substrate is etched using the metal layer as a catalyst to form a minute uneven structure on the surface of the silicon substrate.

One embodiment of the present invention disclosed in this specification is a method for processing a silicon substrate which includes a first step of forming a thin film including a metal having higher electronegativity than silicon and having a plurality of openings by a gas phase method on a silicon substrate, a second step of soaking the silicon substrate subjected to the first step in a hydrofluoric acid solution containing oxidizer, and a third step of soaking the silicon substrate subjected to the second step in an ammonia aqueous solution containing oxidizer, in which a minute structure is formed on a surface of the silicon substrate by performing the steps in the above order.

A simple substance of the metal, an alloy including the metal, or an oxide including the metal can be used for the thin film. Further, it is preferable that the thin film be silver or a silver alloy.

Furthermore, it is preferable that a thickness of the thin film be less than 30 nm.

Further, it is preferable that an aperture ratio of the thin film be higher than or equal to 8% and lower than or equal to 50%.

According to one embodiment of the present invention, minute unevenness can be formed on a surface of a silicon substrate and thus the reflectance of the surface of the silicon substrate can be reduced.

BRIEF DESCRIPTION OF THE DRAWINGS

FIGS. 8A and 8B are cross-sectional views each illustrating a photoelectric conversion device.

FIGS. 11A to 11F are SEM images of surfaces of samples in which silver is formed on silicon substrates.

FIGS. 12A1, 12B1, and 12C1 are SEM images of surfaces of samples in which silver or a silver alloy is formed on silicon substrates and FIGS. 12A2, 12B2, and 12C2 are SEM images of the surfaces of the samples after etching.

DETAILED DESCRIPTION OF THE INVENTION

Figure 1:
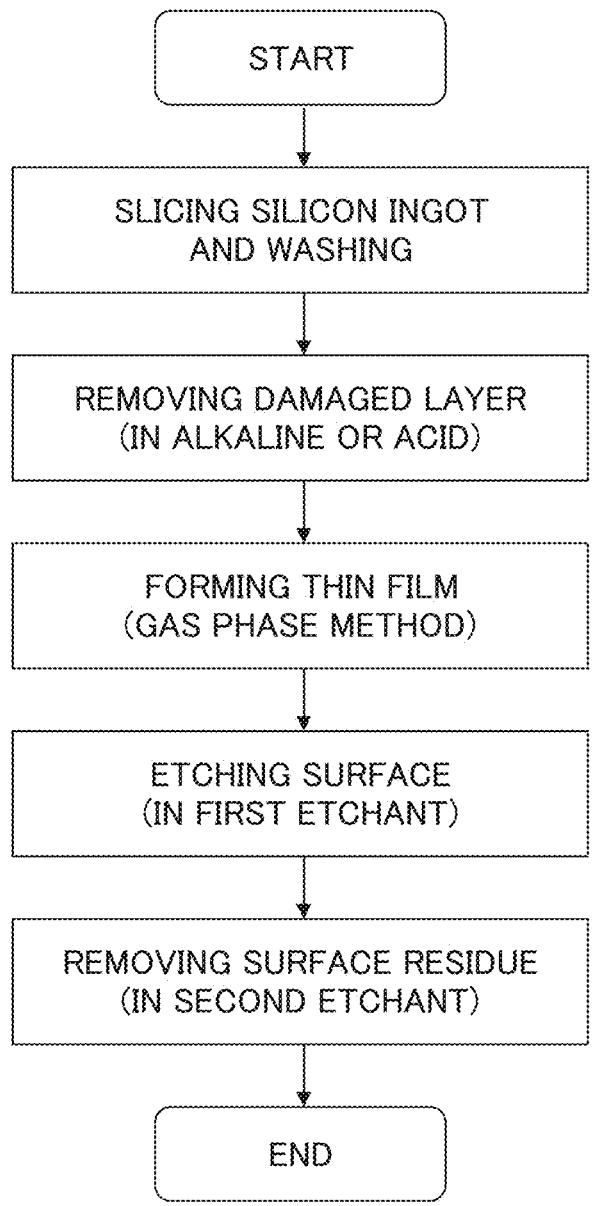
FIG. 1 shows a procedure for forming unevenness on a silicon substrate.

Hereinafter, embodiments of the present invention will be described in detail with reference to the accompanying drawings. However, the present invention is not limited to the description below, and it is easily understood by those skilled in the art that modes and details disclosed herein can be modified in various ways without departing from the spirit and the scope of the present invention. Therefore, the present invention is not construed as being limited to description of the embodiments. In the drawings for explaining the embodiments, the same portions or portions having similar functions are denoted by the same reference numerals, and description of such portions is not repeated in some cases.

Embodiment 1

In this embodiment, a method for processing a silicon substrate in which a minute uneven structure is formed on a surface of the silicon substrate which is one embodiment of the present invention is described.

Note that unevenness which can be formed using one embodiment of the present invention has a projection whose height and pitch are each a nanometer size. The surface of the silicon substrate having the unevenness has extremely low reflectance in a wide wavelength range.

FIG. 1 shows a procedure for forming unevenness on the surface of the silicon substrate according to one embodiment of the present invention. Note that either a single crystal silicon substrate or a polycrystalline silicon substrate can be used as the substrate used in one embodiment of the present invention.

First, a silicon ingot is sliced with a wire saw or the like to form a substrate. The conductivity type of the silicon ingot and a type of an impurity for imparting the conductivity type are not limited and can be determined by the practitioner in accordance with its purpose.

Subsequently, the sliced silicon substrate is cleaned. The silicon substrate includes powder of a material constituting the wire saw or the loose grain in addition to silicon particles produced by slicing. In order to remove these, any one of ultrasonic cleaning, swing cleaning, shower cleaning, brush cleaning, or the like is performed. Alternatively, the cleaning is sequentially performed with a combination of two or more of the above cleanings. Further, the cleaning can be performed using water or a commercial organic alkaline cleaner.

Next, a damaged layer is removed. In the vicinity of a surface of the silicon substrate which has been cut with the wire saw or the like, there is a region where performance as a semiconductor is drastically lowered by crystal defects due to mechanical damage, contamination due to contact with an impurity substance, or the like. Such a region is referred to as the damaged layer, and a region at a depth of 10 μm to 20 μm from the surface of the silicon substrate is preferably removed. For an etchant, an alkaline solution with a relatively high concentration, for example, a 10 to 50% sodium hydroxide aqueous solution or a 10 to 50% potassium hydroxide aqueous solution can be used. Alternatively, a mixed acid in which hydrofluoric acid and nitric acid are mixed, or the mixed acid to which acetic acid is further added may be used.

Next, acid cleaning may be performed. Since many impurities such as a metal component are included in the etchant used when the damaged layer is removed, the impurities may be attached to the surface of the silicon substrate after the damaged layer is removed. The acid cleaning is effective for removing such impurities. As an acid, for example, a mixture (FPM) of a 0.5% hydrofluoric acid solution and a 1% hydrogen peroxide solution, or the like can be used. Alternatively, RCA cleaning or the like may be performed.

Next, a thin film having a plurality of openings is formed on the surface of the silicon substrate. The thin film can be formed using a material including a metal having higher electronegativity than silicon. As the metal, for example, a simple substance such as gold, platinum, silver, copper, or lead, or an alloy including any of those can be given. Alternatively, an alloy including the metal and another metal or an oxide including the metal may be used. The metal component serves as a catalyst in a later etching step.

Note that the thin film having openings in this specification means a state in which holes are formed in the film thickness direction of a structure forming the thin film and differs from a state in which the surface of the silicon substrate is dotted with structures that are particles.

As the alloy including a metal having higher electronegativity than silicon, a silver alloy is preferably used. For example, a silver-palladium alloy, a silver-copper alloy, a silver-palladium-copper alloy, or the like is given. Any alloy described as an example has a composition of another metal to silver of 10% or lower, preferably 5% or lower, more preferably 1% or lower. The thin film can be formed at a smaller amount of the silver alloy than the case of using a simple substance of silver.

Further, as the oxide having higher electronegativity than silicon, silver oxide, copper oxide, palladium oxide, or the like can be given.

Note that it is necessary to provide a plurality of openings in the thin film. When the surface of the silicon substrate is covered without providing the openings, the silicon substrate cannot be subjected to etching. The openings may be formed through a photolithography step, an etching step, laser processing, or the like after the formation of the thin film. Alternatively, it is simple and thus preferable that the thin film having openings be formed by controlling a process in which the thin film is formed from an island-shaped substance attached to on the surface of the thin film in the initial stage of the deposition by a gas phase method. Further, since the above metal causes deterioration of a lifetime of the silicon substrate, it is preferable that the thin film be formed at an amount as small as possible in consideration of a later cleaning step or the like.

Note that as the gas phase method, for example, a sputtering method or an evaporation method can be used. Further, the gas phase method is preferable in that the purity of a thin film to be formed, the composition of an alloy, or the like is more easily controlled as compared to a liquid phase method such as a plating method.

In order to form the thin film having a plurality of openings by the gas phase method, it is preferable that the thin film have a thickness less than 30 nm. Further, in order to promote a later etching step and to obtain an appropriate uneven shape, it is preferable that the thin film have an aperture ratio higher than or equal to 8% and lower than or equal to 50%.

In the case where unevenness is formed only on one surface of the silicon substrate, the thin film may be formed only on the one surface of the silicon substrate. Note that a resist mask or the like may be formed on the other surface of the silicon substrate because etching slightly proceeds on the other surface of the silicon substrate due to fine metal particles attached to the substrate or a metal ion in an etchant. In the case where unevenness is formed on both surfaces of the silicon substrate, the thin film may be formed on the both surfaces of the silicon substrate.

Next, the silicon substrate on which the thin film has been formed is soaked in a first etchant, whereby the surface of the silicon substrate is etched to form unevenness. As the first etchant, a hydrofluoric acid solution containing oxidizer can be used. Here, as the oxidizer, hydrogen peroxide, nitric acid, permanganate, or chromates can be used.

The concentration of the hydrofluoric acid solution used for the first etchant is higher than or equal to 0.5% and less than or equal to 10%, preferably higher than or equal to 2% and less than or equal to 8%, more preferably higher than or equal to 4% and less than or equal to 6%. Further, the concentration of the oxidizer used for the first etchant is higher than or equal to 0.1% and less than or equal to 3%, preferably higher than or equal to 0.5% and less than or equal to 2%, more preferably higher than or equal to 0.5% and less than or equal to 1.5%. Furthermore, it is preferable that the solution temperature of the first etchant be set at room temperature and treatment for 5 minutes to 30 minutes be performed. For example, the etching step may be performed with the use of a mixture of a 5% hydrofluoric acid solution and a 1% hydrogen peroxide solution at room temperature for 10 minutes.

The silicon substrate is soaked in the hydrofluoric acid solution containing oxidizer while the metal having higher electronegativity than silicon is contacted with the silicon substrate, whereby oxidation of silicon around the metal is promoted by electrochemical reaction and the oxidized silicon is immediately etched by the hydrofluoric acid. Note that this phenomenon is disclosed in detail as one factor of generation of roughness on a surface of a silicon substrate at the time of washing in H. Morinaga et al., "Behavior of Ultra fine Metallic Particles on Silicon Wafer Surface", J. Electrochem. Soc. 142[3], pp. 966-970, 1995.

In one embodiment of the present invention, the etching on the surface of the silicon substrate is isotropically started from edge portions of the openings of the thin film; therefore, the height of an projection formed in a region which has been the openings tends to be relatively large and the height of a projection formed in a region which has been below the thin film tends to be relatively small. Accordingly, the height of unevenness on the surface of silicon formed using one embodiment of the present invention tends to be irregular, which leads to a reduction in reflectance in a wide wavelength range. The reflectance shows wavelength dependence depending on the uneven shape; therefore, the uneven shape is preferably irregular in order to reduce the reflectance in a wide wavelength range.

Note that with the use of the above alloy or oxide as the thin film formed on the silicon substrate, the oxidation rate can be locally changed; therefore, irregularity of an uneven shape to be formed can be more remarkable.

Next, the silicon substrate having unevenness is soaked in a second etchant, whereby a residue on the surface is removed. Here, the components of the residue on the surface are a fine piece of silicon which is a part of the silicon substrate that has not been etched and a fine piece of the above thin film. By removal of these, the silicon substrate having a clean uneven surface can be obtained.

As the second etchant, an ammonia aqueous solution containing oxidizer can be used. Here, as the oxidizer, hydrogen peroxide is preferably used.

The concentration of the ammonia aqueous solution used for the second etchant is higher than or equal to 0.5% and less than or equal to 5%, preferably higher than or equal to 1% and less than or equal to 4.5%, more preferably higher than or equal to 1.5% and less than or equal to 4%. Further, the concentration of the oxidizer used for the second etchant is higher than or equal to 0.5% and less than or equal to 5%, preferably higher than or equal to 1% and less than or equal to 4.5%, more preferably higher than or equal to 1.5% and less than or equal to 4%. Furthermore, it is preferable that the solution temperature of the second etchant be higher than or equal to 50° C. and lower than or equal to 80° C. and treatment for 1 minute to 30 minutes be performed. For example, the step of removing the residue on the surface may be performed with the use of a mixture of a 3% ammonia aqueous solution and a 3% hydrogen peroxide solution at 60° C. for 30 minutes.

In the second etchant, oxidation of silicon by the oxidizer and etching of silicon oxide by the ammonia aqueous solution concurrently proceed; therefore, the fine piece of silicon disappears and the fine piece of the thin film is lifted off and removed from the surface of the silicon substrate. Note that the step of removing the residue on the surface using the second etchant may be performed once or plural times in order to increase an effect of removal. In addition, the silicon substrate from which the residue on the surface is removed may be soaked in a hydrofluoric acid solution, whereby an oxide formed on the surface of the silicon substrate may be removed.

Further, in the case where silver or the above silver alloy is used for the thin film, the silicon substrate may be soaked in nitric acid after the step of removing the residue on the surface, whereby the components of the thin film which remain are removed. At this time, for the nitric acid, nitric acid at a concentration of 60% or higher is preferably used. By complete removal of the components of the thin film, a lifetime of the silicon substrate can be improved.

Through the above process, the minute uneven structure of a nanometer size can be formed on the surface of the silicon substrate and thus the reflectance of the surface of the silicon substrate can be reduced in a wide wavelength range.

Note that the range of uses of the silicon substrate having the minute uneven structure formed in one embodiment of the present invention is not limited; however, it is preferable that the silicon substrate be used in a photoelectric conversion device because reflected light can be reduced as much as possible in a wide wavelength range.

This embodiment can be freely combined with any of the other embodiments and an example.

Embodiment 2

In this embodiment, a photoelectric conversion device which can be formed using the silicon substrate having a minute uneven structure described in Embodiment 1 and a manufacturing method thereof are described.

Figure 2A:
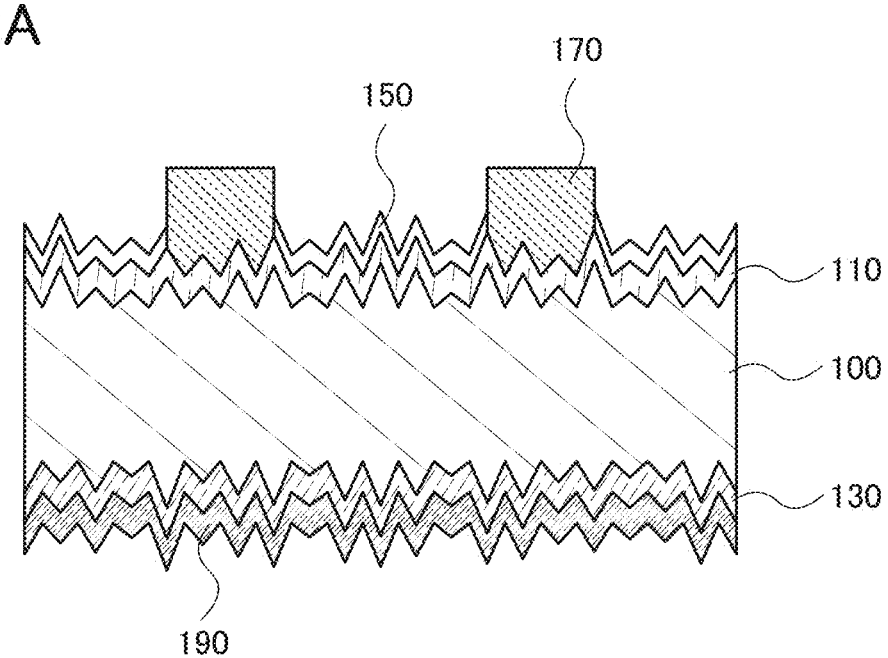
FIGS. 2A and 2B are cross-sectional views each illustrating a photoelectric conversion device.
Figure 2B:
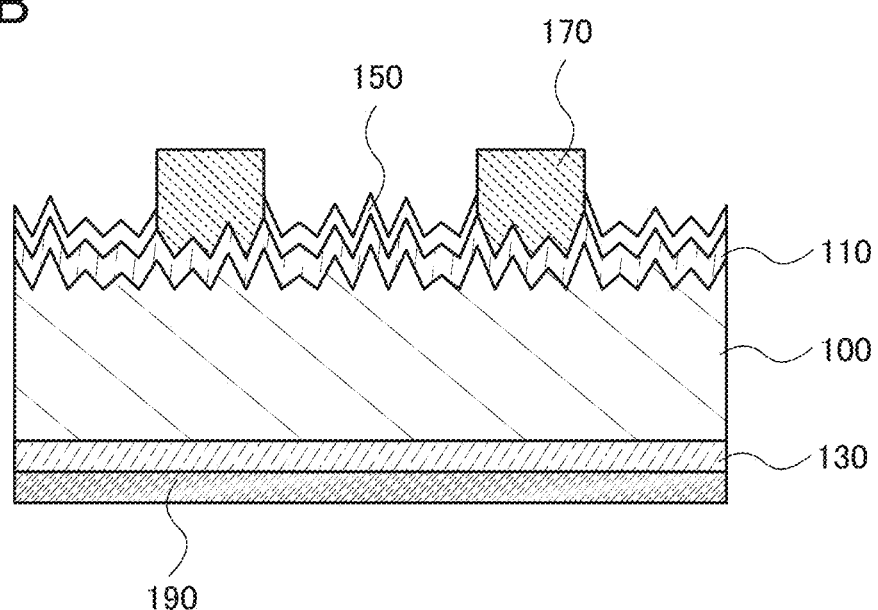

The photoelectric conversion devices shown in FIGS. 2A and 2B each include a silicon substrate 100 whose surface has unevenness, a first region 110 formed on one surface of the silicon substrate 100, a second region 130 formed on the other surface of the silicon substrate 100, an insulating layer 150 formed on the first region 110, a first electrode 170 in contact with the first region 110, and a second electrode 190 in contact with the second region 130. Note that the first electrode 170 is a grid electrode, and a surface on the first electrode 170 side serves as a light-receiving surface.

In FIG. 2A, both surfaces of the silicon substrate have unevenness, which can be formed in such a manner that both the surfaces of the silicon substrate are subjected to the process for forming unevenness described in Embodiment 1. Further, in FIG. 2B, only one surface of the silicon substrate has unevenness, which can be formed in such a manner that the one surface of the silicon substrate is subjected to the process for forming unevenness described in Embodiment 1.

Incident light is reflected in a multiple manner on the surface processed to have unevenness, and travels obliquely in the silicon substrate; thus, the optical path length is increased. In addition, a light trapping effect in which reflected light by the back surface is totally reflected at the surface can occur.

Note that the surface area of the silicon substrate is increased by the unevenness; thus, while the optical effect described above can be obtained, the absolute amount of surface defects is increased. Therefore, in consideration of the balance between the optical effect and the amount of the surface defects, the practitioner may select the structure shown in FIG. 2A or FIG. 2B so that more favorable electric characteristics can be obtained.

The silicon substrate 100 has one conductivity type, and the first region 110 is a region having a conductivity type opposite to that of the silicon substrate 100. Thus, a p-n junction is formed at the interface between the silicon substrate 100 and the first region 110.

The second region 130 is a back surface field (BSF) layer, which has the same conductivity type as the silicon substrate 100 and has higher carrier density than the silicon substrate 100. When the BSF layer is formed, an n-n$^+$ junction or a p-p$^+$ junction is formed, and minority carriers are repelled by the electric field of the n-n$^+$ junction or the p-p$^+$ junction and attracted to the p-n junction side, whereby recombination of carriers in the vicinity of the second electrode 190 can be prevented.

The second region 130 can be easily formed by diffusing impurities contained in the second electrode 190. For example, when the silicon substrate 100 has p-type conductivity, an aluminum film or an aluminum paste is formed as the second electrode 190, and thermal diffusion of aluminum which is an impurity imparting p-type conductivity is performed, whereby the second region 130 can be formed.

Further, over the first region 110, the insulating layer 150 having a light-transmitting property is preferably provided in a portion except a junction between the first region 110 and the first electrode 170. Provision of the insulating layer 150 has a protection effect, an antireflection effect, and an effect of reducing surface defects on the first region 110. As the insulating layer 150 having a light-transmitting property, a silicon oxide film or a silicon nitride film formed by a plasma CVD method or a sputtering method can be used.

Next, a method for manufacturing the photoelectric conversion device, which is illustrated in FIG. 2A, will be described with reference to FIGS. 3A to 3C and FIGS. 4A to 4C.

Figure 3A:
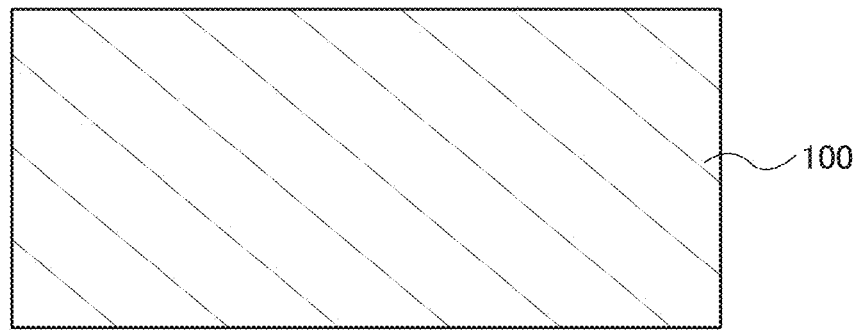
FIGS. 3A to 3C are process cross-sectional views illustrating a method for manufacturing a photoelectric conversion device.
Figure 3B:
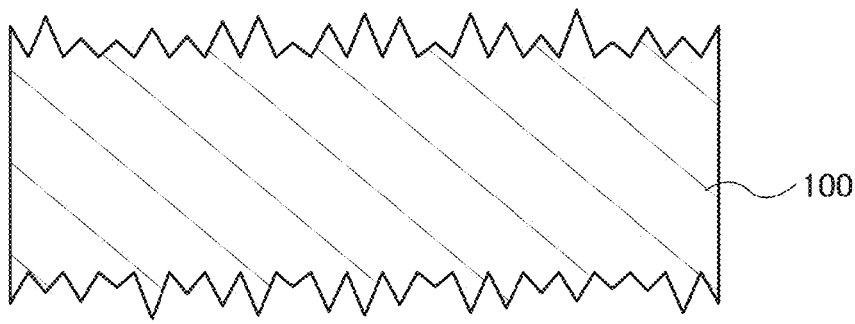

A single crystal silicon substrate or a polycrystalline silicon substrate can be used for the silicon substrate 100 that can be used in one embodiment of the present invention (see FIG. 3A). Note that the conductivity type and the manufacturing method of the silicon substrate 100 are not limited and can be determined by the practitioner as appropriate. In this embodiment, an example in which a p-type silicon substrate is used as the silicon substrate 100 is described.

Next, the surface and the back surface of the silicon substrate 100 are processed to have unevenness. Embodiment 1 can be referred to for the processing method for forming the unevenness (see FIG. 3B).

Figure 3C:
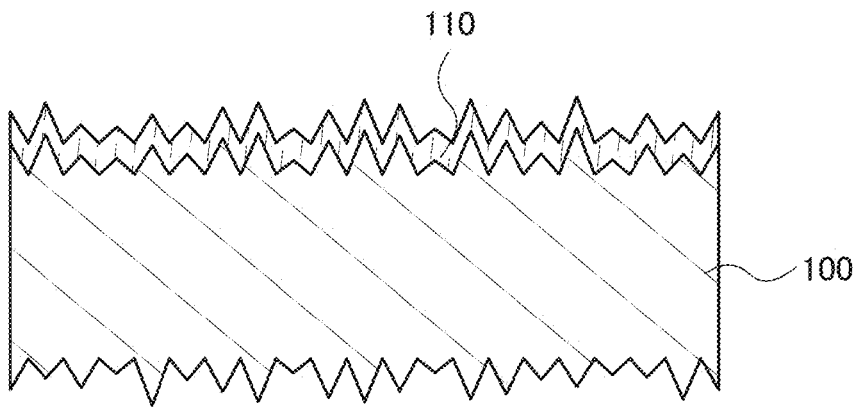

Here, the conductivity type of the silicon substrate 100 is p-type; thus, impurities imparting n-type conductivity are diffused into a surface layer of the silicon substrate 100, so that the first region 110 is formed (see FIG. 3C). As the impurities imparting n-type conductivity, phosphorus, arsenic, antimony, and the like can be given. For example, the silicon substrate is subjected to heat treatment at a temperature higher than or equal to 800° C. and lower than or equal to 900° C. in an atmosphere of phosphorus oxychloride, whereby phosphorus can be diffused at a depth of approximately 0.5 µm from the surface of the silicon substrate. Alternatively, the first region 110 can be formed on the one surface of the silicon substrate 100 in such a manner that a mask is formed on the other surface of the silicon substrate by an existing method or after the formation of diffusion layers on both the surfaces of the silicon substrate, the diffusion layer on the other surface of the silicon substrate is etched by an existing method.

Figure 4A:
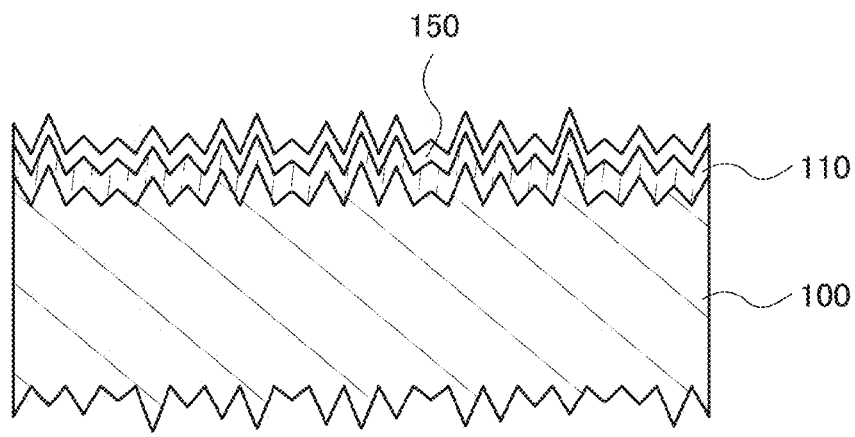
FIGS. 4A to 4C are process cross-sectional views illustrating a method for manufacturing a photoelectric conversion device.

Next, the insulating layer 150 having a light-transmitting property is formed over the first region 110 (see FIG. 4A). A silicon oxide film or a silicon nitride film having a thickness greater than or equal to 50 nm and less than or equal to 100 nm, which is formed by a plasma CVD method or a sputtering method, can be used as the insulating layer 150. In this embodiment, a silicon nitride film having a thickness of 50 nm formed by a plasma CVD method is used as the insulating layer 150.

Figure 4B:
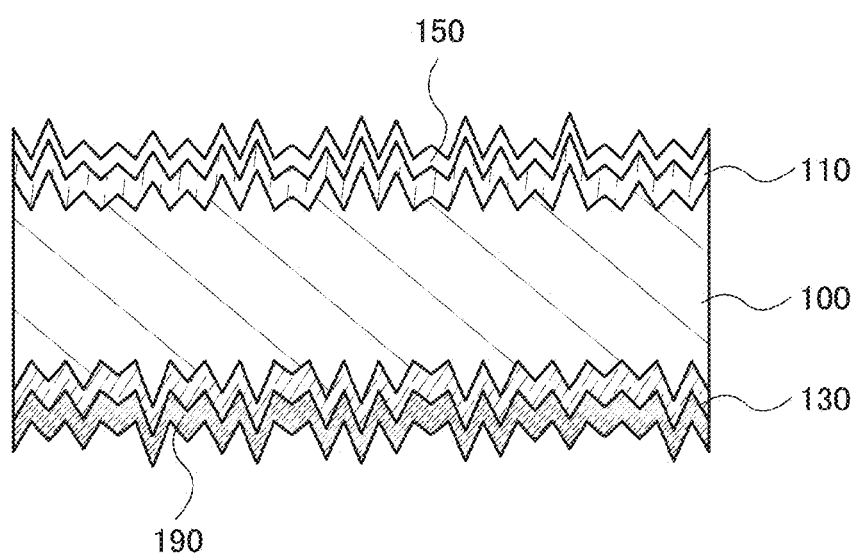

Next, the second region 130 and the second electrode 190 are formed (see FIG. 4B). In this embodiment, the conductivity type of the silicon substrate 100 is p-type; thus, a conductive layer including impurities imparting p-type conductivity is formed on the other surface of the silicon substrate 100, and the impurities are diffused to form a layer with a high carrier concentration, so that a p-p$^+$ junction is formed. The second region 130 and the second electrode 190 can be formed, for example, in the following manner: an aluminum paste is applied to the other surface of the silicon substrate 100 and baking is performed to thermally diffuse aluminum into the surface layer of the other surface of the silicon substrate 100.

Next, by a screen printing method, a conductive resin to be the first electrode 170 is applied on the insulating layer 150. Note that the conductive resin used here may be a silver paste, a copper paste, a nickel paste, a molybdenum paste, or the like. Further, the first electrode 170 may be a stacked layer of different materials, such as a stacked layer of a silver paste and a copper paste. Further, the conductive resin may be applied using a dispensing method, an inkjet method, or the like.

Figure 4C:
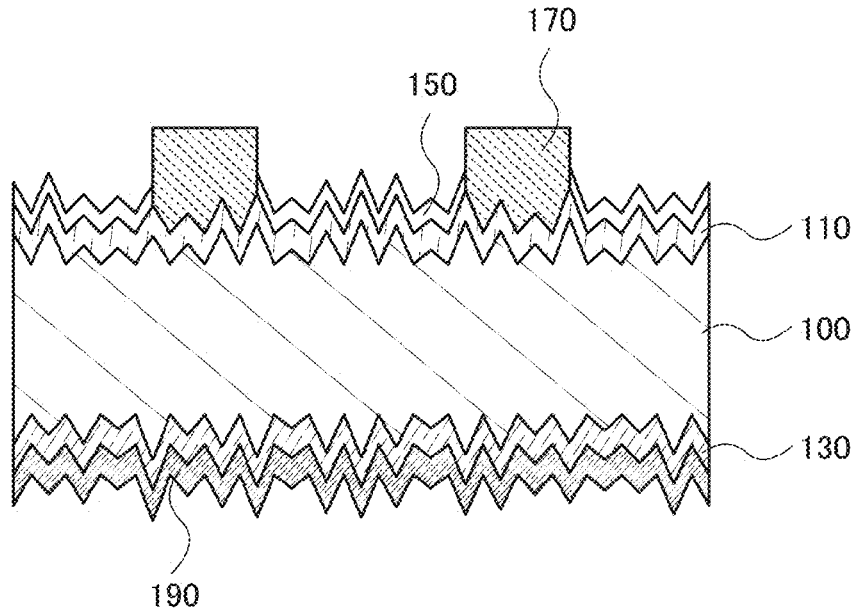

Next, the conductive resin is baked, so that the first region 110 is in contact with the first electrode 170 (see FIG. 4C). The conductive resin is not in contact with the first region 110 at the aforementioned stage where the conductive resin is applied because the insulating layer 150 is provided therebetween. However, the conductor component of the conductive resin can penetrate the insulating layer 150 and be in contact with the first region 110 by baking the conductive resin.

As described above, according to one embodiment of the present invention, a photoelectric conversion device having excellent electric characteristics can be formed.

This embodiment can be freely combined with any of the other embodiments and an example.

Embodiment 3

In this embodiment, a photoelectric conversion device which has a different structure from that of the photoelectric conversion device described in Embodiment 2 and a manufacturing method thereof are described.

Figure 5A:
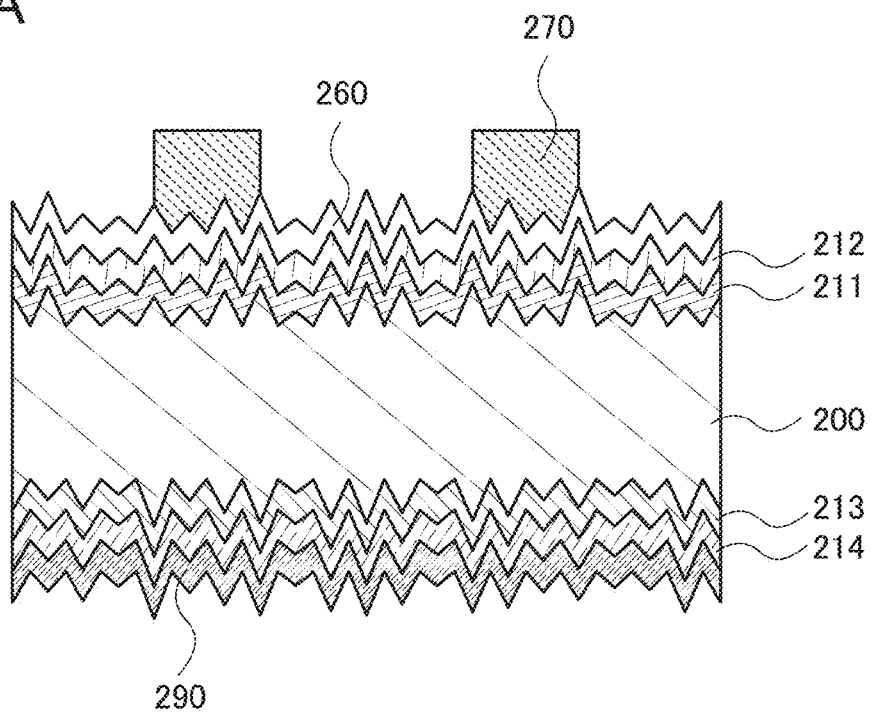
FIGS. 5A and 5B are cross-sectional views each illustrating a photoelectric conversion device.
Figure 5B:
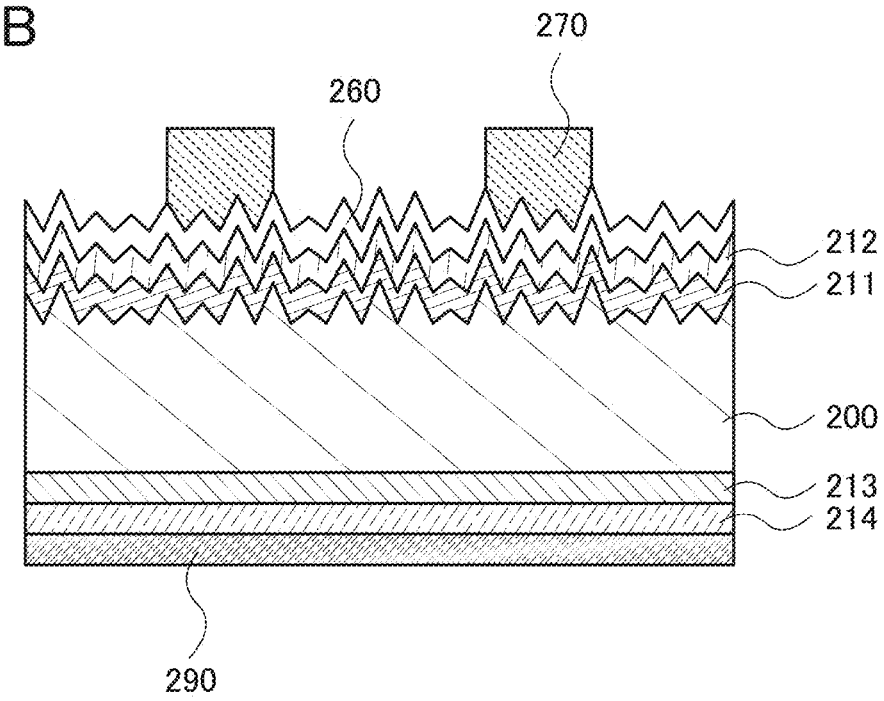

In each of the photoelectric conversion devices shown in FIGS. 5A and 5B, a first silicon semiconductor layer 211, a second silicon semiconductor layer 212, a light-transmitting conductive film 260, and a first electrode 270 are stacked in this order on one surface of a silicon substrate 200 whose surface has unevenness, and a third silicon semiconductor layer 213, a fourth silicon semiconductor layer 214, and a second electrode 290 are stacked in this order on the other surface of the silicon substrate 200. Note that the first electrode 270 is a grid electrode, and the surface on which the first electrode 270 is formed serves as a light-receiving surface. In addition, the second electrode 290 may be a grid electrode, and both surfaces of the silicon substrate 200 may serve as light-receiving surfaces. In that case, a light-transmitting conductive film is preferably provided between the fourth silicon semiconductor layer 214 and the second electrode 290.

In FIG. 5A, both surfaces of the silicon substrate have unevenness, which can be formed in such a manner that both the surfaces of the silicon substrate are subjected to the process for forming unevenness described in Embodiment 1. Further, in FIG. 5B, only one surface of the silicon substrate has unevenness, which can be formed in such a manner that the one surface of the silicon substrate is subjected to the process for forming unevenness described in Embodiment 1.

Incident light is reflected in a multiple manner on the surface processed to have unevenness, and travels obliquely in the silicon substrate; thus, the optical path length is increased. In addition, a light trapping effect in which reflected light by the back surface is totally reflected at the surface can occur.

Note that the surface area of the silicon substrate is increased by the unevenness; thus, while the optical effect described above can be obtained, the absolute amount of surface defects is increased. Therefore, in consideration of the balance between the optical effect and the amount of the surface defects, the practitioner may select the structure shown in FIG. 5A or FIG. 5B so that more favorable electric characteristics can be obtained.

Here, the first silicon semiconductor layer 211 and the third silicon semiconductor layer 213 are high-quality i-type semiconductor layers each containing hydrogen and fewer defects; therefore, surface defects on the silicon substrate 200 can be reduced. Note that in this specification, an "i-type semiconductor" refers to not only an intrinsic semiconductor in which the Fermi level lies in the middle of the band gap, but also a semiconductor in which the concentration of an impurity imparting p-type or n-type conductivity is $1\times10^{20}$ cm$^{-3}$ or lower and the photoconductivity is 100 times or more as high as the dark conductivity. This i-type silicon semiconductor may include an element belonging to Group 13 or Group 15 in the periodic table as an impurity.

The silicon substrate 200 has one conductivity type, and the second silicon semiconductor layer 212 is a semiconductor layer having a conductivity type opposite to that of the silicon substrate 200. Thus, a p-n junction is formed between the silicon substrate 200 and the second silicon semiconductor layer 212 with the first silicon semiconductor layer 211 provided therebetween.

The fourth silicon semiconductor layer 214 has the same conductivity type as the silicon substrate 200 and has higher carrier density than the silicon substrate 200. A p-p$^+$ junction or an n-n$^+$ junction is formed between the silicon substrate 200 and the fourth silicon semiconductor layer 214 with the third silicon semiconductor layer 213 provided therebetween. That is, the fourth silicon semiconductor layer 214 functions as a BSF layer.

Next, a method for manufacturing the photoelectric conversion device, which is illustrated in FIG. 5A, will be described with reference to FIGS. 6A to 6C and FIGS. 7A to 7C.

A single crystal silicon substrate or a polycrystalline silicon substrate can be used for the silicon substrate 200 that can be used in one embodiment of the present invention. Note that the conductivity type and the manufacturing method of the silicon substrate 200 are not limited and can be determined by the practitioner as appropriate. In this embodiment, an example of using an n-type silicon substrate is described.

Figure 6A:
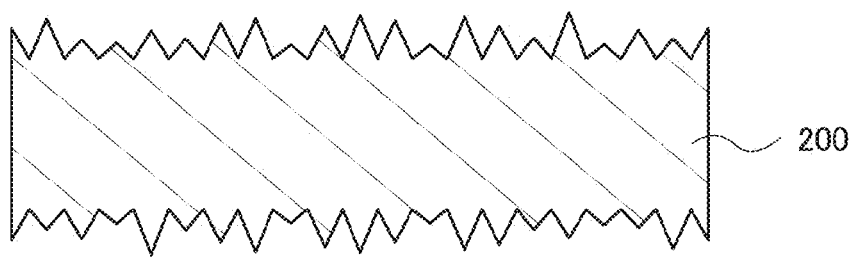
FIGS. 6A to 6C are process cross-sectional views illustrating a method for manufacturing a photoelectric conversion device.

Next, the surface and the back surface of the silicon substrate 200 are processed to have unevenness (see FIG. 6A). Embodiment 1 can be referred to for the processing method for forming the unevenness.

Next, the first silicon semiconductor layer 211 is formed on the one surface of the silicon substrate 200 by a plasma CVD method. The first silicon semiconductor layer 211 preferably has a thickness greater than or equal to 3 nm and less than or equal to 50 nm. In this embodiment, the first silicon semiconductor layer 211 is i-type amorphous silicon and has a thickness of 5 nm.

An example of film formation conditions of the first silicon semiconductor layer 211 is as follows: monosilane with a flow rate greater than or equal to 5 sccm and less than or equal to 200 sccm is introduced to a reaction chamber; the pressure inside the reaction chamber is greater than or equal to 10 Pa and less than or equal to 100 Pa; the electrode interval is greater than or equal to 15 mm and less than or equal to 40 mm; and the power density is greater than or equal to 8 mW/cm$^2$ and less than or equal to 50 mW/cm$^2$.

Figure 6B:
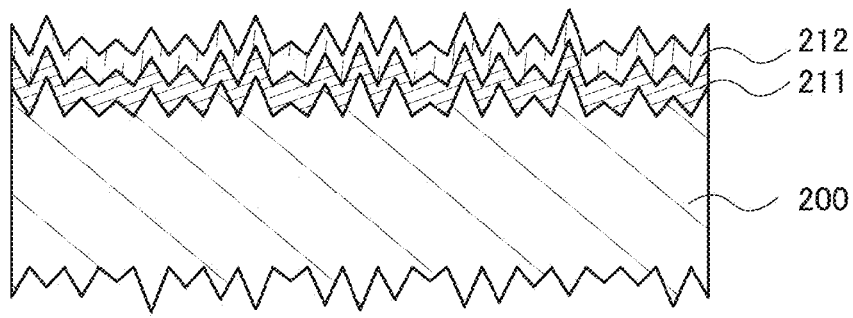

Next, the second silicon semiconductor layer 212 is formed on the first silicon semiconductor layer 211 (see FIG. 6B). The second silicon semiconductor layer 212 preferably has a thickness greater than or equal to 3 nm and less than or equal to 50 nm. In this embodiment, the second silicon semiconductor layer 212 is p-type microcrystalline silicon and has a thickness of 10 nm. Note that p-type amorphous silicon may be used for the second silicon semiconductor layer 212.

An example of film formation conditions of the second silicon semiconductor layer 212 is as follows: monosilane with a flow rate greater than or equal to 1 sccm and less than or equal to 10 sccm, hydrogen with a flow rate greater than or equal to 100 sccm and less than or equal to 5000 sccm, and a hydrogen-based diborane (0.1%) with a flow rate greater than or equal to 5 sccm and less than or equal to 50 sccm are introduced into a reaction chamber; the pressure inside the reaction chamber is greater than or equal to 450 Pa and less than or equal to 100000 Pa, preferably greater than or equal to 2000 Pa and less than or equal to 50000 Pa; the electrode interval is greater than or equal to 8 mm and less than or equal to 30 mm; and the power density is greater than or equal to 200 mW/cm$^2$ and less than or equal to 1500 mW/cm$^2$.

Next, the third silicon semiconductor layer 213 is formed on the other surface of the silicon substrate 200 by a plasma CVD method. The third silicon semiconductor layer 213 preferably has a thickness greater than or equal to 3 nm and less than or equal to 50 nm. In this embodiment, the third silicon semiconductor layer 213 is i-type amorphous silicon and has a thickness of 5 nm. Note that the third silicon semiconductor layer 213 can be formed under the film formation conditions similar to those of the first silicon semiconductor layer 211.

Figure 6C:
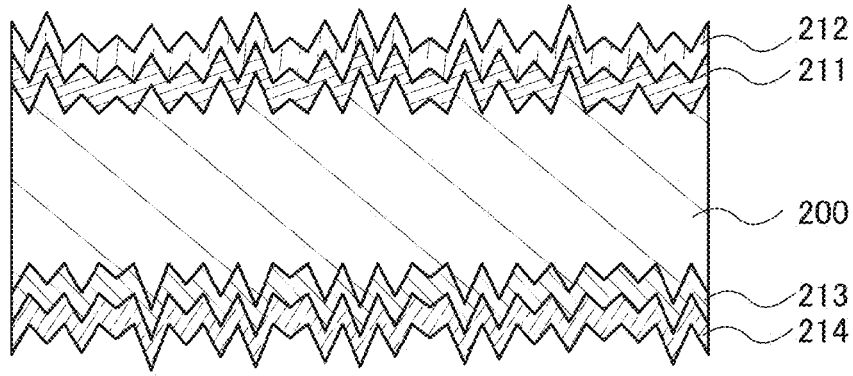

Next, the fourth silicon semiconductor layer 214 is formed on the third silicon semiconductor layer 213 (see FIG. 6C). The fourth silicon semiconductor layer 214 preferably has a thickness greater than or equal to 3 nm and less than or equal to 50 nm.

In this embodiment, the fourth silicon semiconductor layer 214 is n-type microcrystalline silicon and has a thickness of 10 nm. Note that n-type amorphous silicon may be used for the fourth silicon semiconductor layer 214.

An example of film formation conditions of the fourth silicon semiconductor layer 214 is as follows: monosilane with a flow rate greater than or equal to 1 sccm and less than or equal to 10 sccm, hydrogen with a flow rate greater than or equal to 100 sccm and less than or equal to 5000 sccm, and a hydrogen-based phosphine (0.5%) with a flow rate greater than or equal to 5 sccm and less than or equal to 50 sccm are introduced into a reaction chamber; the pressure inside the reaction chamber is greater than or equal to 450 Pa and less than or equal to 100000 Pa, preferably greater than or equal to 2000 Pa and less than or equal to 50000 Pa; the electrode interval is greater than or equal to 8 mm and less than or equal to 30 mm; and the power density is greater than or equal to 200 mW/cm$^2$ and less than or equal to 1500 mW/cm$^2$.

Note that in this embodiment, although an RF power source with a frequency of 13.56 MHz is used as a power source in forming the silicon semiconductor layers, an RF power source with a frequency of 27.12 MHz, 60 MHz, or 100 MHz may be used instead. In addition, the deposition may be carried out by not only continuous discharge but also pulse discharge. The implementation of pulse discharge can improve the film quality and reduce particles produced in the gas phase.

Figure 7A:
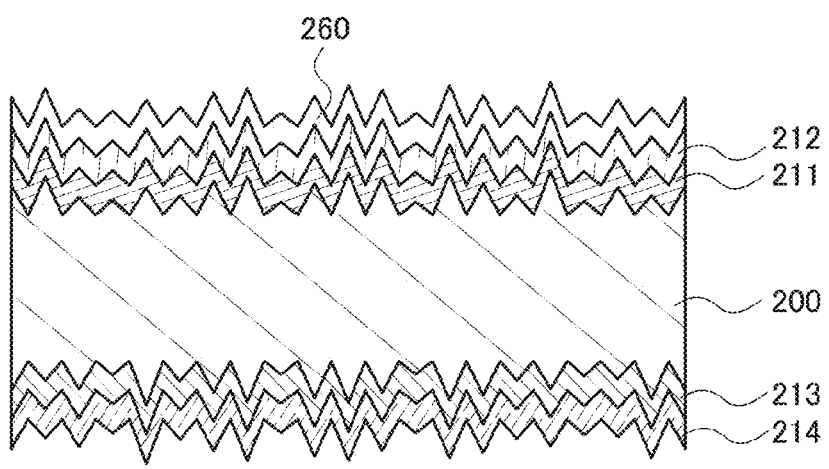
FIGS. 7A to 7C are process cross-sectional views illustrating a method for manufacturing a photoelectric conversion device.

Next, the light-transmitting conductive film 260 is formed over the second silicon semiconductor layer 212 (see FIG. 7A). For the light-transmitting conductive film 260, the following can be used: indium tin oxide; indium tin oxide containing silicon; indium oxide containing zinc; zinc oxide; zinc oxide containing gallium; zinc oxide containing aluminum; tin oxide; tin oxide containing fluorine; tin oxide containing antimony; graphene, or the like. The light-transmitting conductive film 260 is not limited to a single layer, and may be a stacked layer of different films. For example, a stacked layer of an indium tin oxide and a zinc oxide containing aluminum, a stacked layer of an indium tin oxide and a tin oxide containing fluorine, etc. can be used. The total thickness is greater than or equal to 10 nm and less than or equal to 1000 nm.

Figure 7B:
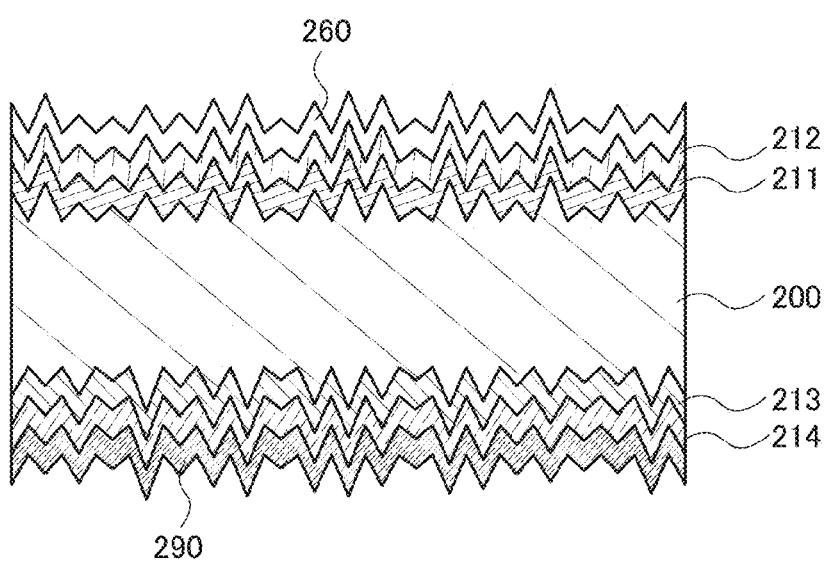

Next, the second electrode 290 is formed on the fourth silicon semiconductor layer 214 (see FIG. 7B). The second electrode 290 can be formed using a low-resistance metal such as silver, aluminum, or copper by a sputtering method, a vacuum evaporation method, or the like. Alternatively, the second electrode 290 may be formed using a conductive resin such as a silver paste or a copper paste by a screen printing method.

Note that the formation order of the films provided on the surface and the back surface of the silicon substrate 200 is not limited to the order described above as long as the structure shown in FIG. 7B can be obtained. For example, the first silicon semiconductor layer 211 may be formed, and then the third silicon semiconductor layer 213 may be formed.

Figure 7C:
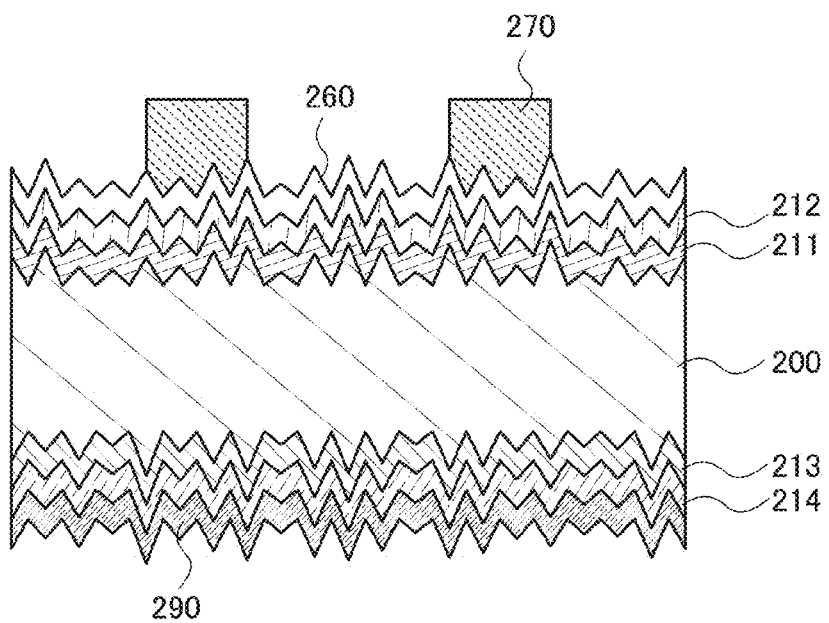

Next, by a screen printing method, a conductive resin is applied on the light-transmitting conductive film 260 and is baked, so that the first electrode 270 is formed (see FIG. 7C). Note that the conductive resin used here may be a silver paste, a copper paste, a nickel paste, a molybdenum paste, or the like. Further, the first electrode 270 may be a stacked layer of different materials, such as a stacked layer of a silver paste and a copper paste. Note that the conductive resin may be applied using a dispensing method, an inkjet method, or the like.

As described above, according to one embodiment of the present invention, a photoelectric conversion device having excellent electric characteristics can be formed.

This embodiment can be freely combined with any of the other embodiments and an example.

Embodiment 4

In this embodiment, a photoelectric conversion device which has a different structure from those of the photoelectric conversion devices described in Embodiments 2 and 3 and a manufacturing method thereof are described.

The photoelectric conversion devices shown in FIGS. 8A and 8B each include a silicon substrate 300 whose surface has unevenness, a first insulating layer 321 formed on one surface of the silicon substrate 300, a first region 311 and a second region 312 which are formed in the other surface of the silicon substrate 300, a second insulating layer 322 formed on the other surface of the silicon substrate 300, a first electrode 370 in contact with the first region 311, and a second electrode 390 in contact with the second region 312. Note that the surface on which the first insulating layer 321 is formed serves as a light-receiving surface.

In FIG. 8A, both surfaces of the silicon substrate have unevenness, which can be formed in such a manner that both the surfaces of the silicon substrate are subjected to the process for forming unevenness described in Embodiment 1. Further, in FIG. 8B, only one surface of the silicon substrate has unevenness, which can be formed in such a manner that the one surface of the silicon substrate is subjected to the process for forming unevenness described in Embodiment 1.

Incident light is reflected in a multiple manner on the surface processed to have unevenness, and travels obliquely in the silicon substrate; thus, the optical path length is increased. In addition, a light trapping effect in which reflected light by the back surface is totally reflected at the surface can occur.

Note that the surface area of the silicon substrate is increased by the unevenness; thus, while the optical effect described above can be obtained, the absolute amount of surface defects is increased. Therefore, in consideration of the balance between the optical effect and the amount of the surface defects, the practitioner may select the structure shown in FIG. 8A or FIG. 8B so that more favorable electric characteristics can be obtained.

The silicon substrate 300 has one conductivity type, and the first region 311 is a region having a conductivity type opposite to that of the silicon substrate 300. Thus, a p-n junction is formed at the interface between the silicon substrate 300 and the first region 311.

The second region 312 is a back surface field (BSF) layer, which has the same conductivity type as the silicon substrate 300 and has higher carrier density than the silicon substrate 300. When the BSF layer is formed, an n-n$^+$ junction or a p-p$^+$ junction is formed, and minority carriers are repelled by the electric field of the n-n$^+$ junction or the p-p$^+$ junction and attracted to the p-n junction side, whereby recombination of carriers in the vicinity of the second electrode 390 can be prevented.

Further, over the one surface of the silicon substrate 300, the first insulating layer 321 having a light-transmitting property is preferably provided. Provision of the insulating layer has a protection effect, an antireflection effect, and an effect of reducing surface defects of the silicon substrate 300. As the first insulating layer 321 having a light-transmitting property, a silicon oxide film or a silicon nitride film formed by a plasma CVD method or a sputtering method can be used. The surface defects of the silicon substrate 300 can be further reduced by the provision of the second insulating layer 322.

Each of the structures of the photoelectric conversion devices shown in FIGS. 8A and 8B is also referred to as a back contact type, in which an electrode is formed on one surface side of a substrate. Thus, a grid electrode and the like are not formed on the light-receiving surface side, so that a shadow loss is eliminated and conversion efficiency can be increased. In each of FIGS. 8A and 8B, the first region 311 on the p-n junction side is larger than the second region 312; however, the first region 311 and the second region 312 may have substantially the same size. Further, there is no limitation on the numbers of the first regions 311 and the second regions 312. The number of the first regions 311 is not necessarily the same as that of the second regions 312.

Next, a method for manufacturing the photoelectric conversion device shown in FIG. 8A is described with reference to FIGS. 9A to 9C and FIGS. 10A to 10C.

A single crystal silicon substrate or a polycrystalline silicon substrate can be used for the silicon substrate 300 which can be used in one embodiment of the present invention. Note that the conductivity type and the manufacturing method of the silicon substrate 300 are not limited and can be determined by the practitioner as appropriate. In this embodiment, an example of using a p-type silicon substrate is described.

Next, the surface and the back surface of the silicon substrate 300 are subjected to a process for forming unevenness. Embodiment 1 can be referred to for the processing method for forming the unevenness (see FIG. 9A).

Figure 9A:
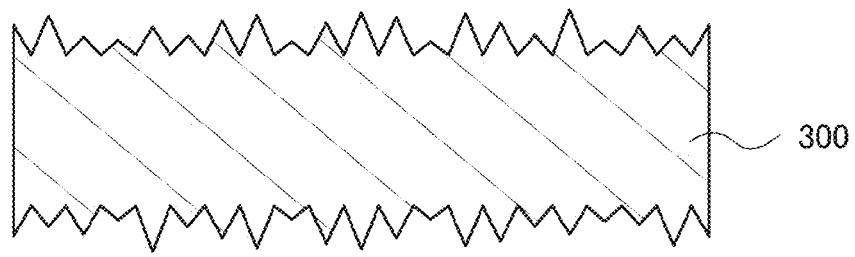
FIGS. 9A to 9C are process cross-sectional views illustrating a method for manufacturing a photoelectric conversion device.
Figure 9B:
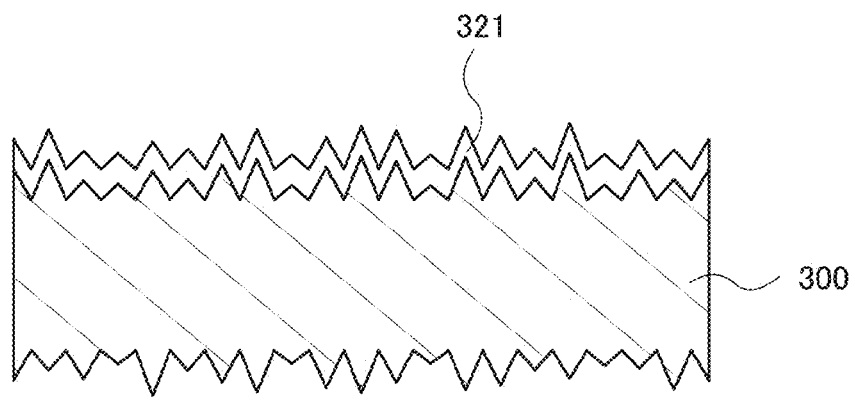
Figure 9C:
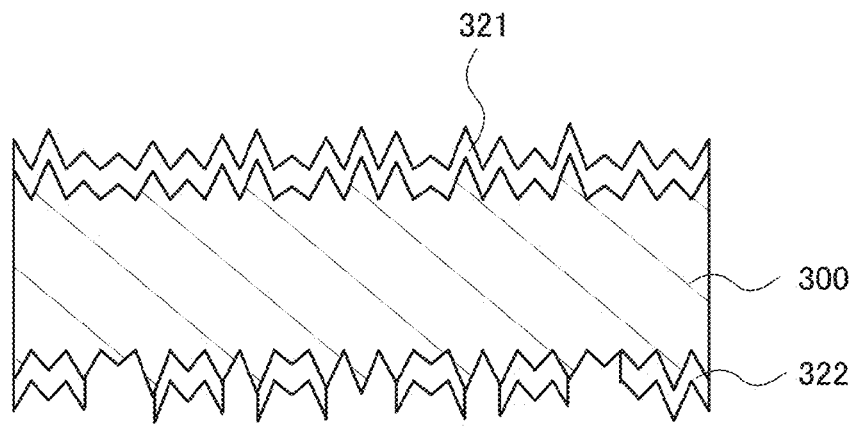

Next, the first insulating layer 321 having a light-transmitting property is formed on the one surface of the silicon substrate 300 (see FIG. 9B). A silicon oxide film or a silicon nitride film having a thickness greater than or equal to 50 nm and less than or equal to 100 nm, which is formed by a plasma CVD method or a sputtering method, can be used as the first insulating layer 321. In this embodiment, a silicon nitride film having a thickness of 50 nm formed by a plasma CVD method is used as the first insulating layer 321.

Next, the second insulating layer 322 is formed on the other surface of the silicon substrate 300. A silicon oxide film or a silicon nitride film having a thickness greater than or equal to 50 nm and less than or equal to 100 nm, which is formed by a plasma CVD method or a sputtering method, can be used as the second insulating layer 322. When such a film is used, an opening is provided in the second insulating layer 322 using a known processing technique (see FIG. 9C). Alternatively, the second insulating layer 322 may be formed using a heat-resistant insulating resin by a screen printing method.

Figure 10A:
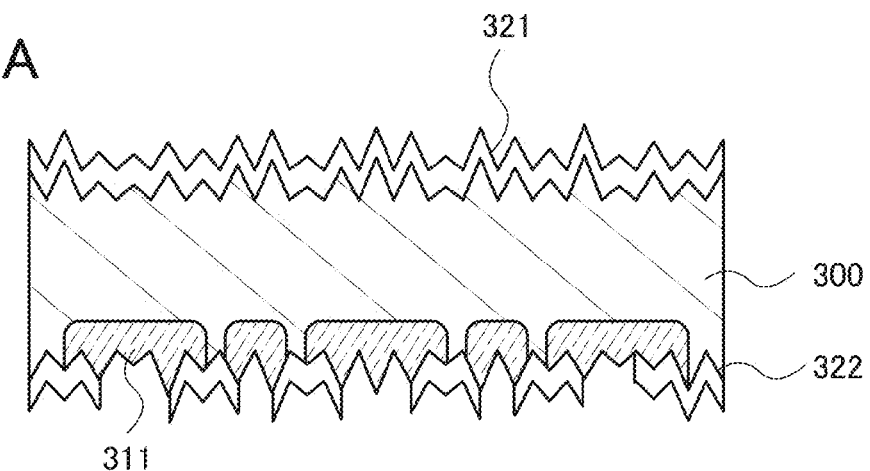
FIGS. 10A to 10C are process cross-sectional views illustrating a method for manufacturing a photoelectric conversion device.

Next, the first region 311 is formed (see FIG. 10A). Here, the conductivity type of the silicon substrate 300 is p-type; thus, the first region 311 is formed to be a region having n-type conductivity. The first region 311 is formed in such a manner that impurities imparting n-type conductivity are diffused from the opening in the second insulating layer 322 formed on the other surface of the silicon substrate 300. As the impurities imparting n-type conductivity, phosphorus, arsenic, antimony, and the like can be given. For example, the silicon substrate is subjected to heat treatment at a temperature higher than or equal to 800° C. and lower than or equal to 900° C. in an atmosphere of phosphorus oxychloride, whereby phosphorus can be diffused at a depth of approximately 0.5 μm from the surface of the silicon substrate. Note that at this stage, the impurities imparting n-type conductivity are also diffused into the region where the second region 312 is to be formed.

Figure 10B:
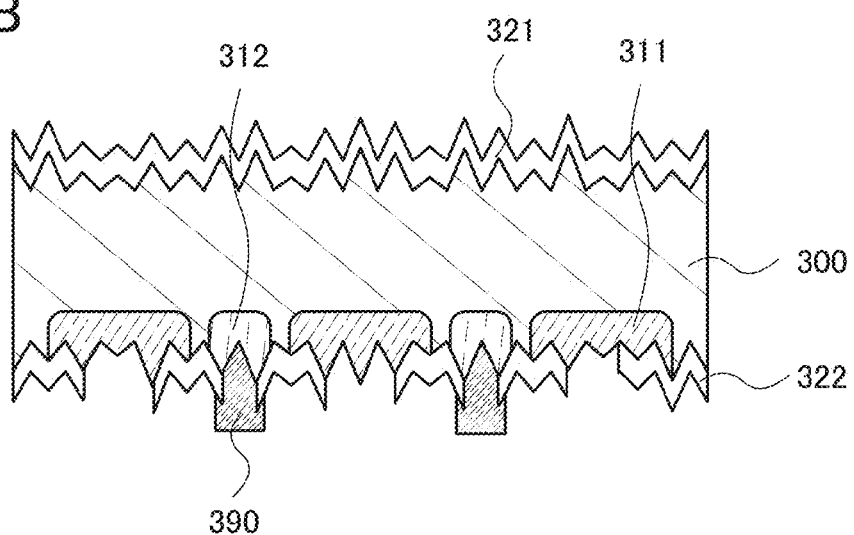

Next, a material containing impurities imparting p-type conductivity is formed on the other surface of the silicon substrate 300 so as to cover the opening in the second insulating layer 322 reaching the region to be the second region 312, and the impurities are diffused to form a layer with a high carrier concentration, so that the n-type region is changed into the second region 312 which is $p^+$ type (see FIG. 10B). Through these steps, a p-$p^+$ junction is formed. For example, an aluminum paste is formed so as to cover the opening reaching the region to be the second region 312 by a screen printing method and baking is performed to thermally diffuse aluminum into the region which has become the n-type region in the preceding step, so that the second region 312 and the second electrode 390 are formed.

Figure 10C:
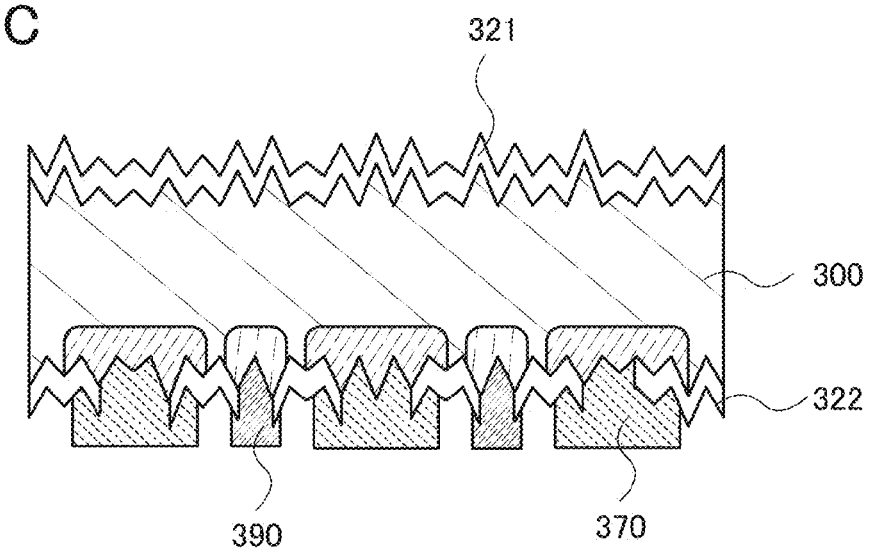

Subsequently, a conductive resin is applied so as to cover the opening in the second insulating layer 322 reaching the region to be the first region 311 by a screen printing method, and baking is performed, so that the first electrode 370 is formed (see FIG. 10C). For the conductive resin, an aluminum paste, a silver paste, a copper paste, a nickel paste, a molybdenum paste, or the like can be used. Further, the first electrode 370 may be a stacked layer of different materials, such as a stacked layer of a silver paste and a copper paste. Note that the conductive resin may be applied using a dispensing method, an inkjet method, or the like.

As described above, according to one embodiment of the present invention, a photoelectric conversion device having excellent electric characteristics can be formed.

This embodiment can be freely combined with any of the other embodiments and an example.

Example 1

In this example, experimental results of thin films formed on the silicon substrates described in Embodiment 1 are described.

FIGS. 11A to 11F are each a SEM image of a surface of a sample in which silver is formed to have a thickness of 4 nm to 30 nm by a sputtering method on a silicon substrate. FIGS. 11A to 11F are all photographed at a tilt angle of 30°. As for sputtering conditions, a silver target of ϕ 6 inches (99.99%) was used; argon was used as a sputtering gas; the DC power supply was 120 W; the pressure was 0.4 Pa; and the distance between the substrate and the target was 100 mm.

FIG. 11A is a SEM image of a sample in which silver is formed to have a thickness of 4 nm. It is found that in the case of having a thickness of 4 nm, the surface of the silicon substrate is dotted with fine particles of silver and a film structure is not formed.

FIGS. 11B and 11C are SEM images of samples in which the target thickness is increased to 8 nm and 11 nm, respectively. The particles of silver tend to aggregate when the target thickness is increased and the distance between the particles is increased as the sizes of the particles are increased.

FIGS. 11D and 11E are SEM images of samples in which the target thickness is further increased to 15 nm and 20 nm, respectively. It is found that the particles of silver further aggregate and a film having a plurality of openings has begun to be formed.

Further, FIG. 11F is a SEM image of a sample in which the target thickness is further increased to 30 nm. It is found that an opening cannot be observed and a dense film is formed.

When the SEM images of the samples shown in FIGS. 11A to 11F were binarized by image processing, the aperture ratio was estimated as follows: about 60% in FIGS. 11A and 11B, about 55% in FIG. 11C, about 20% FIG. 11D, about 8% in FIG. 11E, and 0% in FIG. 11F.

Considering that in addition to the above results, in the case where the aperture ratio is less than or equal to 50%, the particles remarkably aggregate to form a film, it is found that the appropriate thickness of the thin film having an opening is greater than or equal to 11 nm and less than 30 nm in the case of using silver as the material of the thin film.

This example can be freely combined with any of the other embodiments and another example.

Example 2

In this example, observation results of surfaces of silicon substrates each having a minute uneven structure manufactured using the method described in Embodiment 1, and optical characteristics of the silicon substrates are described.

FIGS. 12A1, 12B1, and 12C1 are SEM images of samples manufactured in accordance with the procedure of FIG. 1 described in Embodiment 1. A single crystal silicon substrate was used for the substrate, and various samples having different thicknesses were manufactured with the use of a target of silver (99.99%) or a silver-palladium alloy (1%) by a sputtering method. Note that the film formation conditions were the same as those used in Example 1. The surface etching step was performed for 10 minutes at room temperature with the use of a mixture of a 5% hydrofluoric acid solution and a 1% hydrogen peroxide solution, and the step of removing a residue on the surface was performed with the use of a mixture of a 3% ammonia aqueous solution and a 3% hydrogen peroxide solution at 60° C. for 30 minutes.

FIG. 12A1 is a SEM image of a sample in which silver is formed to have a thickness of 17 nm. When this image was binarized, the aperture ratio was estimated to be about 14%. FIGS. 12A1, 12A2, 12B1, 12B2, 12C1, and 12C2 are all photographed at a tilt angle of 30°.

When the surface etching step and the step of removing a residue on the surface were performed in the state shown in FIG. 12A1, unevenness in the state shown in FIG. 12A2 was formed on the surface of the silicon substrate. It is found that the unevenness has a height and pitch of a nanometer size, an irregular shape, and an inclined surface.

Further, FIG. 12B1 is a SEM image of a sample in which a silver-palladium alloy is formed to have a thickness of 8 nm. When this image was subjected to a binarizing process, the aperture ratio was estimated to be about 17%. It is found that the silver-palladium alloy does not aggregate more easily than silver, and that in the case where the silver-palladium alloy is used, a thin film having a desired opening can be formed even when the thickness of the thin film is thinner than the case of using a simple substance of silver.

When the surface etching step and the step of removing a residue on the surface were performed in the state shown in FIG. 12B1, unevenness in the state shown in FIG. 12B2 was formed on the surface of the silicon substrate. It is found that also in the case of using the silver-palladium alloy, minute unevenness having an inclined surface can be formed although the shape is slightly different from the case of using the simple substance of silver.

FIG. 12C1 is a SEM image of a sample in which the silver-palladium alloy is formed to have a thickness of 2 nm. It is found that in the case of the silver-palladium alloy having a thickness of 2 nm, the surface of the silicon substrate is dotted with fine particles of the silver-palladium alloy and a film structure is not formed.

When the surface etching step and the step of removing a residue on the surface were performed in the state shown in FIG. 12C1, unevenness in the state shown in FIG. 12C2 was formed on the surface of the silicon substrate. The unevenness includes many surfaces that are substantially parallel or substantially perpendicular to an original front surface or back surface of the silicon substrate. Due to such an uneven surface, not only reflected light cannot be sufficiently reduced, but also coverage with a film covering the uneven surface becomes poor. For example, in the photoelectric conversion devices described in Embodiments 2 to 4, the uneven surface needs to be covered with an insulating film or a semiconductor film. When the coverage is poor, favorable electric characteristics cannot be obtained. The uneven structures shown in FIGS. 12A2 and 12B2 each have an inclined surface and it can be said that the coverage with a film covering the uneven surface is favorable.

Note that the uneven surface shown in FIG. 12C2 has substantially the same structure as the uneven surface formed by a method disclosed in Patent Document 1.

Figure 13:
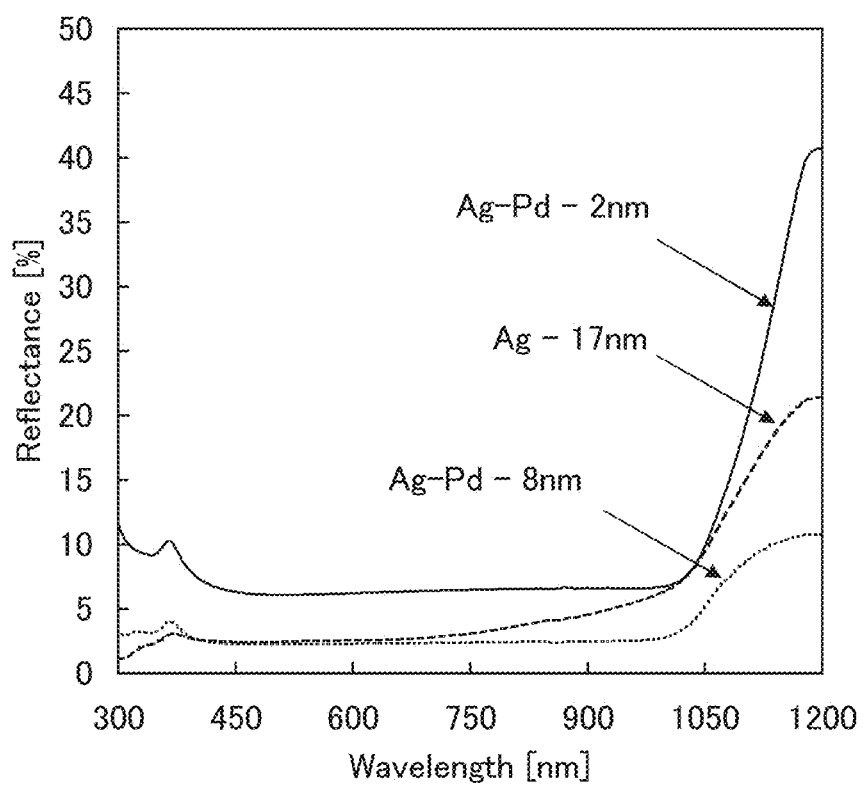
FIG. 13 is a graph comparing reflectance of the surfaces of the silicon substrates each having unevenness.

FIG. 13 shows measurement results of surface reflectance of the samples shown in FIGS. 12A2, 12B2, and 12C2. It is found that the reflectance of the samples shown in FIGS. 12A2 and 12B2 is smaller than that of the sample shown in FIG. 12C2. Therefore, it is confirmed that the silicon substrate having unevenness formed using the thin film having an opening according to one embodiment of the present invention is effective in reducing reflectance.

This example can be freely combined with any of the other embodiments and another example.

This application is based on Japanese Patent Application serial no. 2011-230434 filed with Japan Patent Office on Oct. 20, 2011, the entire contents of which are hereby incorporated by reference.

What is claimed is:

1. A method for manufacturing a device, comprising:
   a first step of forming a thin film on a silicon substrate by a gas phase method, the thin film having a plurality of openings and including a metal having higher electronegativity than silicon;
   a second step of soaking the silicon substrate in a hydrofluoric acid containing an oxidizer; and
   a third step of soaking the silicon substrate in an ammonia aqueous solution containing an oxidizer.

2. The method for manufacturing a device according to claim 1,
   wherein the thin film is a simple substance of the metal, an alloy including the metal, or an oxide including the metal.

3. The method for manufacturing a device according to claim 1,
   wherein the thin film is formed of silver or a silver alloy.

4. The method for manufacturing a device according to claim 3,
   wherein the silver alloy is a silver-palladium alloy, a silver-copper alloy, or a silver-palladium-copper alloy.

5. The method for manufacturing a device according to claim 1,
   wherein a thickness of the thin film is less than 30 nm.

6. The method for manufacturing a device according to claim 1,
wherein an aperture ratio of the thin film is higher than or equal to 8% and lower than or equal to 50%.

7. The method for manufacturing a device according to claim 1,
wherein the silicon substrate is incorporated into a photoelectric conversion device.

8. A method for manufacturing a device, comprising:
a first step of forming a thin film on a silicon substrate by a gas phase method, the thin film having a plurality of openings and including a metal having higher electronegativity than silicon;
a second step of soaking the silicon substrate in a hydrofluoric acid containing an oxidizer; and
a third step of soaking the silicon substrate in an ammonia aqueous solution containing an oxidizer,
wherein a minute structure is formed on a surface of the silicon substrate by performing the first to third steps in the above order.

9. The method for manufacturing a device according to claim 8,
wherein the thin film is a simple substance of the metal, an alloy including the metal, or an oxide including the metal.

10. The method for manufacturing a device according to claim 8,
wherein the thin film is formed of silver or a silver alloy.

11. The method for manufacturing a device according to claim 10,
wherein the silver alloy is a silver-palladium alloy, a silver-copper alloy, or a silver-palladium-copper alloy.

12. The method for manufacturing a device according to claim 8,
wherein a thickness of the thin film is less than 30 nm.

13. The method for manufacturing a device according to claim 8,
wherein an aperture ratio of the thin film is higher than or equal to 8% and lower than or equal to 50%.

14. The method for manufacturing a device according to claim 8,
wherein the silicon substrate is incorporated into a photoelectric conversion device.

15. The method for manufacturing a device according to claim 8,
wherein the minute structure includes a plurality of projections.

16. A method for manufacturing a device, comprising:
a first step of forming a thin film on a silicon substrate by a gas phase method, the thin film having a plurality of openings;
a second step of soaking the silicon substrate in a hydrofluoric acid containing an oxidizer; and
a third step of soaking the silicon substrate in an ammonia aqueous solution containing an oxidizer,
wherein the thin film is formed of silver or a silver alloy.

17. The method for manufacturing a device according to claim 16,
wherein the silver alloy is a silver-palladium alloy, a silver-copper alloy, or a silver-palladium-copper alloy.

18. The method for manufacturing a device according to claim 16,
wherein a thickness of the thin film is less than 30 nm.

19. The method for manufacturing a device according to claim 16,
wherein an aperture ratio of the thin film is higher than or equal to 8% and lower than or equal to 50%.

20. The method for manufacturing a device according to claim 16,
wherein the silicon substrate is incorporated into a photoelectric conversion device.

* * * * *